US008049210B2

(12) United States Patent
Aoki et al.

(10) Patent No.: US 8,049,210 B2
(45) Date of Patent: Nov. 1, 2011

(54) THIN FILM TRANSISTOR, MATRIX SUBSTRATE, ELECTROPHORESIS DISPLAY DEVICE, AND ELECTRONIC APPARATUS

(75) Inventors: Takashi Aoki, Suwa (JP); Soichi Moriya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 115 days.

(21) Appl. No.: 12/356,390

(22) Filed: Jan. 20, 2009

(65) Prior Publication Data

US 2009/0184314 A1    Jul. 23, 2009

(30) Foreign Application Priority Data

Jan. 22, 2008    (JP) .................................. 2008-011698

(51) Int. Cl.
*H01L 35/24* (2006.01)
(52) U.S. Cl. .......... 257/40; 257/249; 257/331; 257/365; 257/E21.638; 438/283
(58) Field of Classification Search .................... 257/40, 257/249, 331, 365, E21.638; 438/283
See application file for complete search history.

(56) References Cited

U.S. PATENT DOCUMENTS 6,930,331 B2 * 8/2005 Park et al. ........................ 257/90
2005/0082573 A1 * 4/2005 Williford ...................... 257/202
2007/0242180 A1 * 10/2007 Choi et al. ...................... 349/43

FOREIGN PATENT DOCUMENTS

JP         2005-302888 A     10/2005

OTHER PUBLICATIONS

Takashi Minakata, "Yuki Toranjisuta no Hyoka to Oyo (Evaluation and Application of Organic Transistor)", Chapter 1, pp. 27-33, CMC Publishing Co., Ltd., Japan.

* cited by examiner

*Primary Examiner* — Wai Sing Louie
(74) *Attorney, Agent, or Firm* — AdvantEdge Law Group, LLC

(57) ABSTRACT

Provided is a thin film transistor including a substrate, a source electrode and a drain electrode disposed above the substrate so as to oppose each other, an organic semiconductor film disposed between the source electrode and the drain electrode to generate a channel region, and a gate electrode disposed opposite the organic semiconductor film via a gate insulating film. The gate electrode includes an aperture in the channel region.

19 Claims, 14 Drawing Sheets

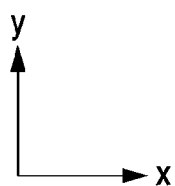

THIN FILM TRANSISTOR, MATRIX SUBSTRATE, ELECTROPHORESIS DISPLAY DEVICE, AND ELECTRONIC APPARATUS

BACKGROUND

1. Technical Field

The present invention relates to thin film transistors and, more specifically, relates to thin film transistors and other devices including organic semiconductor films.

2. Related Art

Recently, organic semiconductor materials have been widely developed as semiconductor materials for thin film transistors (TFT) (for example, refer to "Yuki Toranjisuta no Hyoka to Oyo (Evaluation and application of organic transistor", Chapter 1, Zairyo (Material), CMC Publishing Co., Ltd.). The organic semiconductor has advantages that it can be readily formed into a thin film by a simple process, such as coating or vacuum deposition, at a lower processing temperature compared to those in the cases of known TFTs containing amorphous or polycrystalline silicon. A lower processing temperature allows formation of a film on a plastic substrate having low heat resistance, which leads to reductions in weight and cost of a resulting display. Furthermore, various applications of plastic substrates utilizing the flexibility can be expected.

Furthermore, JP-A-2005-302888 discloses an optical sensor having a transparent gate electrode and a transparent gate insulating film.

The present inventors have investigated and developed display devices, such as electronic paper, having organic transistors and have further studied on transistor characteristics for improving the characteristics of resulting devices.

However, in the display devices, disadvantages such as a threshold shift of the transistor or a decrease in mobility of carriers are caused by repeated display. This may be caused by that the carriers are trapped in the organic transistor, specifically, in the interface between an organic semiconductor film and a gate insulating film or in these films, during repeated display, and the trapped carriers cause a change in transistor characteristics.

SUMMARY

An advantage of some aspects of the invention is to improve the characteristics of a this film transistor having an organic semiconductor film. Another advantage of some aspects of the invention is to improve the characteristics of a matrix substrate, an electrophoresis device, or an electronic apparatus having such a thin film transistor.

The thin film transistor (organic transistor) of the invention includes a substrate, a source electrode and a drain electrode opposing each other above the substrate, an organic semiconductor film disposed between the source electrode and the drain electrode, and a gate electrode above a first surface or a second surface of the organic semiconductor film via a gate insulating film. The gate electrode has an aperture in the channel region that is a region lying between the source electrode and the drain electrode and overlapping the organic semiconductor film.

Such a configuration allows light to enter through the aperture and detrap carriers (electrons or holes) trapped in the channel region. Consequently, deterioration in the characteristics of the thin film transistor can be suppressed.

The gate electrode may include a path, in the channel region, connecting a region where the gate electrode overlaps the source electrode to a region where the gate electrode overlaps the drain electrode. With such a structure, a channel current can flow the path.

The thin film transistor may have a structure that a projection region projected on the organic semiconductor film covers the aperture when it is projected from an end of the aperture toward the interior side of the aperture at an angle of 45° from the direction perpendicular to the gate insulating film direction. With such a structure, a channel current flows in the region corresponding to the aperture, resulting in an improvement in driving performance.

The aperture may lie above the source electrode or the drain electrode. With such a structure, a channel current flows in region corresponding to the aperture, and parasitic capacitance between the gate electrode and the source electrode or between the gate electrode and the drain electrode can be decreased.

The gate electrode may include a plurality of first wiring lines, in the channel region, extending in a first direction from the source electrode to the drain electrode and disposed with a certain distance therebetween. Thus, the gap between the first wiring lines may be used as the aperture.

The gate electrode may include a plurality of second wiring lines, in the channel region, extending in a second direction that intersects the first direction from the source electrode to the drain electrode and disposed with a certain distance therebetween. Thus, the gap between the second wiring lines may be used as the aperture.

The gate electrode may include, in the channel region, a plurality of first wiring lines extending in the first direction from the source electrode to the drain electrode and disposed with a certain distance therebetween and a plurality of second wiring lines extending in the second direction that intersects the first direction and disposed with a certain distance therebetween. Thus, the gaps between the first and the second wiring lines may be used as the apertures.

The gate electrode may include a third wiring line extending in the first direction in an area outside the channel region, and the second wiring lines may be connected one another with the third wiring line.

The gate electrode may include a plurality of apertures arranged in an array form in the channel region.

The semiconductor device according to the invention includes a substrate, a source electrode and a drain electrode disposed above the substrate so as to oppose each other, an organic semiconductor film disposed between the source electrode and the drain electrode, and a gate electrode disposed above a first face or a second face of the organic semiconductor film via a gate insulating film. The gate electrode is an electroconductive film formed by solidifying a dispersion liquid containing electroconductive particles and having pores therein.

With such a structure, light enters through the pores, and carries (electrons or holes) trapped in the channel region can be detrapped. Consequently, deterioration in the characteristics of the thin film transistor can be suppressed. The pores can be formed easily and inexpensively by solidifying a dispersion liquid containing electroconductive particles.

The thin film transistor (organic transistor) according to the invention includes a substrate, a source electrode and a drain electrode disposed above the substrate so as to oppose each other, an organic semiconductor film disposed between the source electrode and the drain electrode, and a gate electrode disposed above a first face or a second face of the organic semiconductor film via a gate insulating film. The gate electrode includes a recess in the channel region that is a region lying between the source electrode and the drain electrode and overlapping the organic semiconductor film.

With such a structure, light enters through the recess, and carriers (electrons or holes) trapped in the channel region can be detrapped. Consequently, deterioration in the characteristics of the thin film transistor can be suppressed. In addition, a channel current flows in an area corresponding to the recess, due to the gate electrode remaining at the bottom of the recess. Consequently, the driving performance of the transistor is improved.

For example, the thickness of the gate electrode at a region serving as the bottom of recess is 100 nm or less and more preferably 50 nm or less. The light transmissivity can be improved by reducing the thickness of the gate electrode remaining as the bottom of the recess.

For example, the gate electrode may be a laminated film composed of a first electroconductive film and a second electroconductive film, where the first electroconductive film is exposed to serve as the bottom of the recess. In such a case, since the bottom of the recess is made of the first electroconductive film, the thickness of the bottom can be readily controlled. That is, the light transmissivity can be readily controlled.

For example, the thickness of the first electroconductive film is 100 nm or less and more preferably 50 nm or less. Thus, the light transmissivity can be improved by reducing the thickness of the first electroconductive film serving as the bottom of the recess.

The matrix substrate of the invention includes a plurality of the above-described thin film transistors. With such a structure, the characteristics of the matrix substrate can be improved.

The electrophoresis display device of the invention includes the matrix substrate. With such a structure, the characteristics of the electrophoresis display device can be improved.

The electronic apparatus of the invention includes the electrophoresis display device. With such a structure, the characteristics of the electronic apparatus can be improved.

DESCRIPTION OF EXEMPLARY EMBODIMENTS

Embodiments of the invention will be described in detail with reference to the accompanying drawings, wherein like numbers reference like elements, and detailed descriptions thereof are omitted.

First Embodiment

Structure of Organic Transistor

Figure 1A:
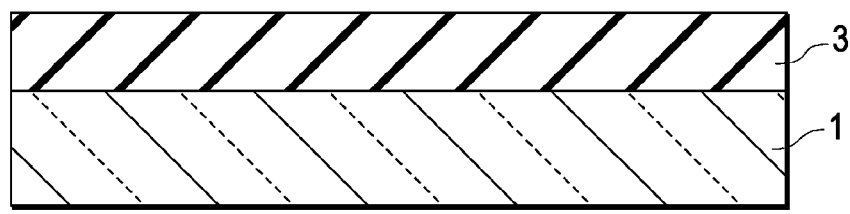
FIG. 1A is a cross-sectional view illustrating a process for producing an organic transistor according to a first embodiment of the invention.
Figure 1B:
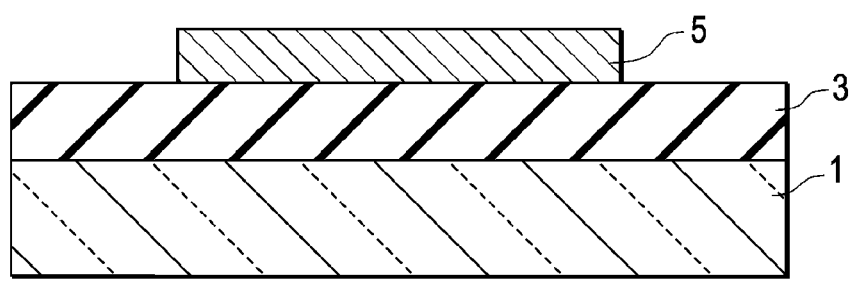
FIG. 1B is a cross-sectional view illustrating the process for producing the organic transistor according to the first embodiment.
Figure 1C:
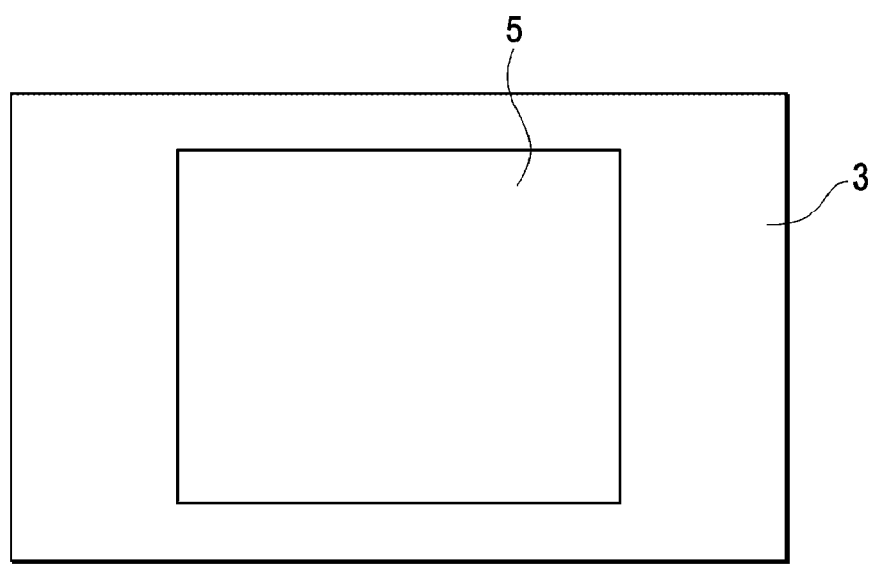
FIG. 1C is a plan view illustrating the process for producing the organic transistor according to the first embodiment.
Figure 2A:
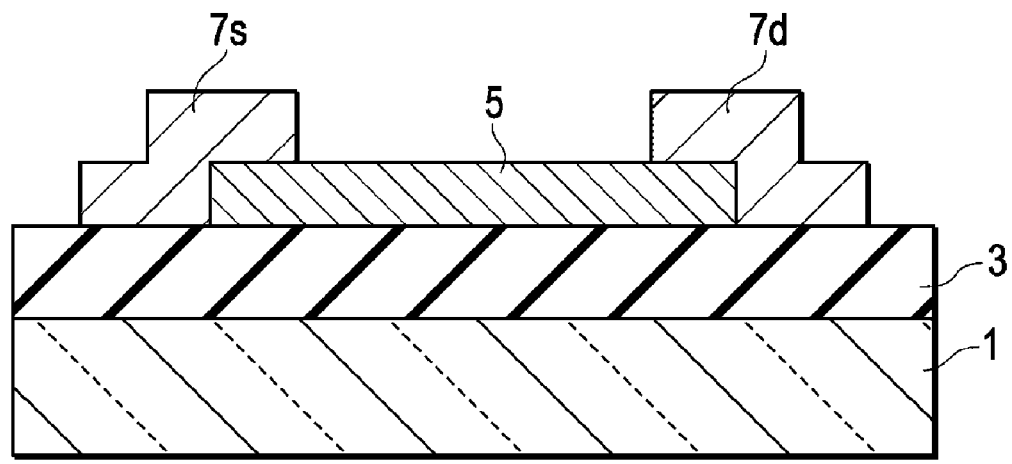
FIG. 2A is a cross-sectional view illustrating the process for producing the organic transistor according to the first embodiment.
Figure 2B:
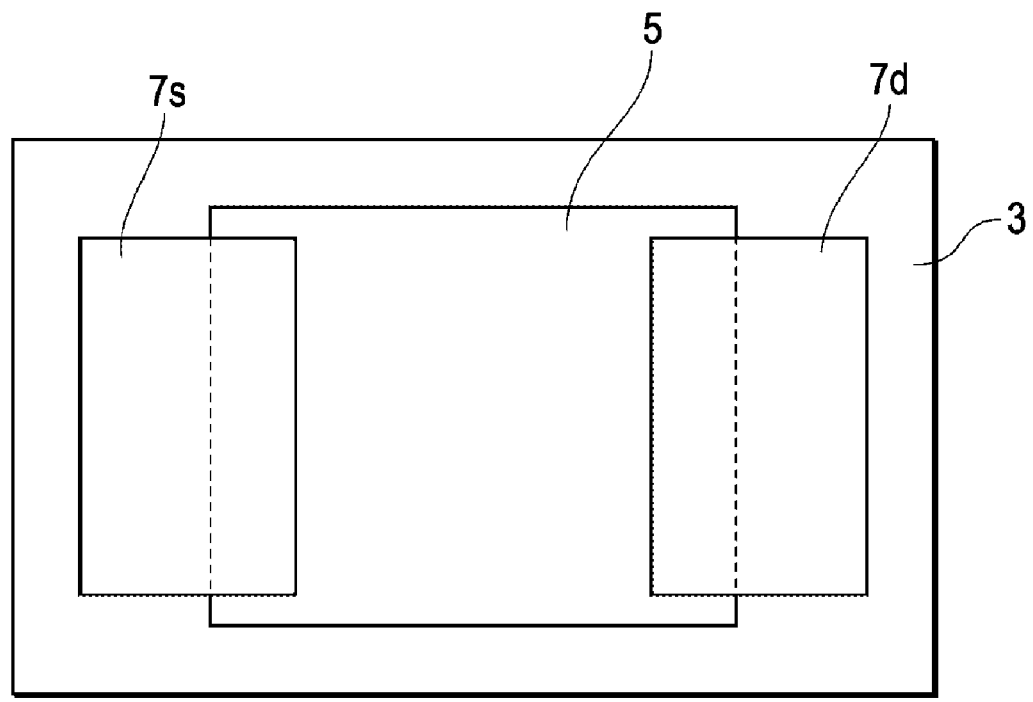
FIG. 2B is a plan view illustrating the process for producing the organic transistor according to the first embodiment.
Figure 3A:
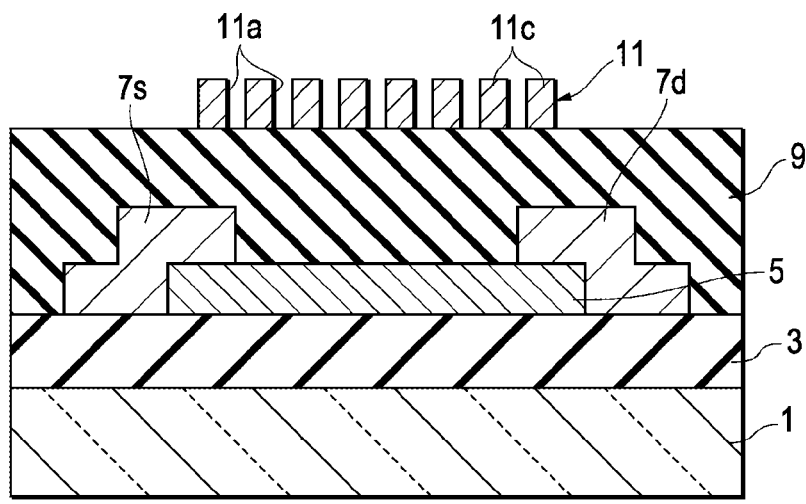
FIG. 3A is a cross-sectional view illustrating the process for producing the organic transistor according to the first embodiment.
Figure 3B:
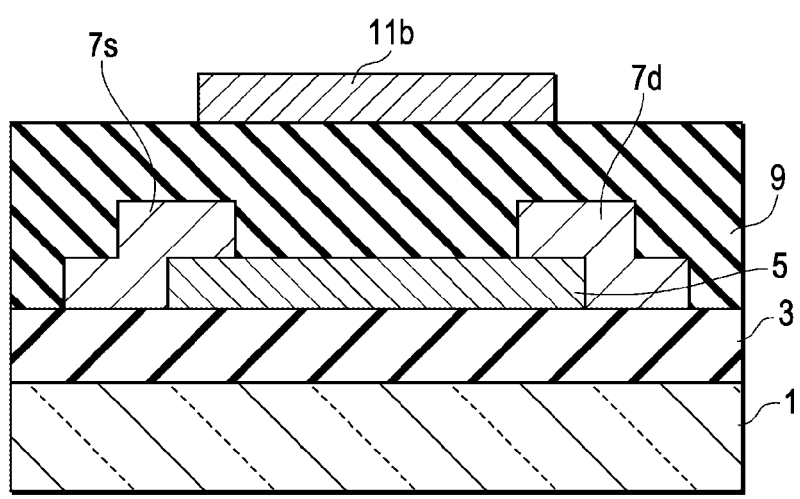
FIG. 3B is a cross-sectional view illustrating the process for producing the organic transistor according to the first embodiment.
Figure 3C:
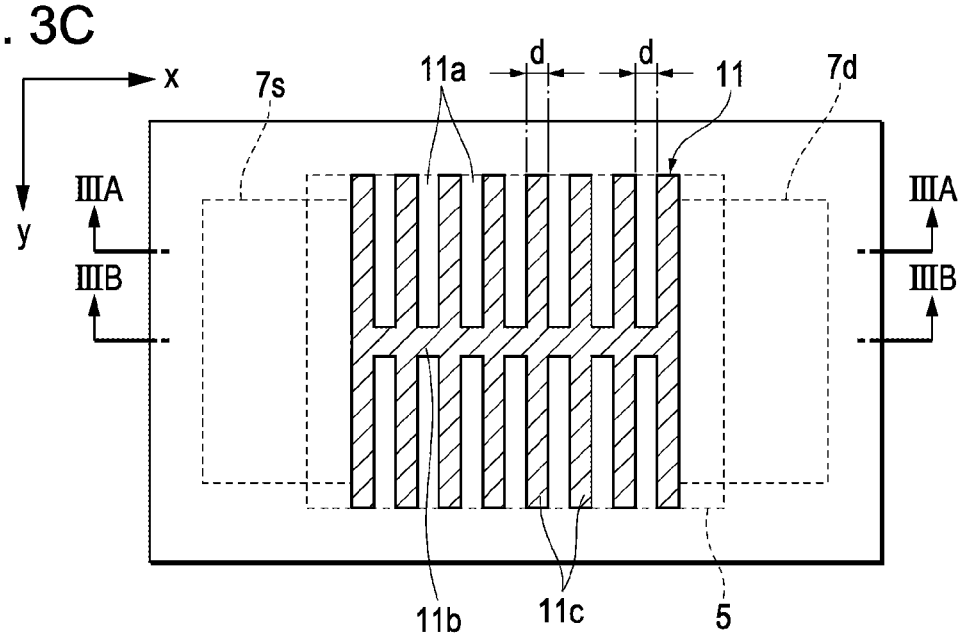
FIG. 3C is a plan view illustrating the process for producing the organic transistor according to the first embodiment.

FIGS. 1A to 1C, 2A, 2B, and 3A to 3C are cross-sectional views or plan views illustrating a process for producing an organic transistor according to an embodiment of the invention. First, the structure of an organic transistor (semiconductor device) according to the embodiment will be described with reference to FIGS. 3A to 3C illustrating the final step for producing the organic transistor. FIGS. 3A and 3B are cross-sectional views, and FIG. 3C is a plan view. FIGS. 3A and 3B are cross sections taken along the IIIA-IIIA line and the IIIB-IIIB line of FIG. 3C, respectively. In the cross-sectional views and the plan view, some portions are drawn to different scales for convenience of description. In addition, in the plan view, some portions are drawn by the hatching for ease of description. The structure of the organic transistor according to this embodiment will be defined in detail in the production process described below. Accordingly, only the characteristic structure will be described here.

As shown in FIG. 3B, the organic transistor of this embodiment includes an underlying insulating film 3 disposed on a substrate 1, an organic semiconductor film 5 disposed thereon, a source electrode 7s and a drain electrode 7d disposed so as to be oppose each other with a certain distance on the organic semiconductor film 5, and a gate electrode 11 (11b, 11c) disposed above the organic semiconductor film 5 via a gate insulating film 9. The organic transistor is a so-called top-gate/top-contact transistor.

The gate electrode 11 herein is provided with apertures 11a (see FIGS. 3A and 3C).

Therefore, light (such as visible light and ultraviolet light) enters the channel region through the apertures 11a and allows carriers (electrons or holes) trapped in the channel region to be detrapped. As a result, deterioration in the characteristics of the thin film transistor can be suppressed, and a change in threshold and a decrease in mobility of carriers caused by the carriers trapped in the channel region can be minimized. Furthermore, the operating life of elements can be extended. The term "detrap" herein means that the carriers (electrons or holes) trapped in a semiconductor, an insulating film, or their interface absorb optical energy and, as a result, are released from the trapping site.

In addition, since the area of the gate electrode is decreased due to the apertures 11a, parasitic capacitance between the gate electrode and the source electrode or between the gate electrode and the drain electrode can be decreased. In particular, the arrangement of the apertures 11a above the source electrode or the drain electrode can decrease parasitic capacitance. Furthermore, as described in detail below, channels (paths of current) are also generated below the apertures 11a by forming the apertures 11a such that the projection regions (R1) projected on the organic semiconductor film 5 cover the apertures 11a when they are projected from the ends of the apertures 11a toward the interior side of the apertures 11a at an angle of 45° from the vertical direction (the direction perpendicular to the gate insulating film direction 9) (see FIG. 5A).

As described above, such a structure can improve transistor characteristics. In particular, as described below, operation speed or contrast can be improved by applying the organic transistor to, for example, a display device as a driving element.

Production Process of Organic Transistor

Next, a process for producing the organic transistor according to this embodiment will now be described with reference to FIGS. 1A to 1C, 2A, 2B, and 3A to 3C, and the structure will be further defined.

Step of Forming Underlying Film

As shown in FIG. 1A, an underlying insulating film 3 of, for example, a silicon oxide film is formed on a substrate 1 such as a glass substrate by chemical vapor deposition (CVD). The substrate 1 may be other than the glass substrate, for example, a substrate made of a metal such as aluminum (Al) or stainless steel or a flexible plastic substrate with a light weight. The plastic substrate may be made of a thermoplastic resin or a thermosetting resin.

Step of Forming Organic Semiconductor Film

Then, as shown in FIGS. 1B and 1C, an organic semiconductor film 5 is formed on the underlying insulating film 3. For example, the organic semiconductor film 5 is formed by applying a poly(3-hexylthiophene) (P3HT) solution, as an organic semiconductor material, on the underlying insulating film 3 by spin coating, and drying and firing (crystallizing) the resulting coating. Then, the organic semiconductor film 5 is patterned into a desired shape, for example, an approximate rectangle (see FIG. 1C).

Then, for example, a photoresist film is formed on the organic semiconductor film 5, followed by exposure and development into an approximately rectangular shaped photoresist film. The organic semiconductor film 5 is etched using this photoresist film as a mask, and then the remaining photoresist film is removed. A series of processes from the formation to the removal of the photoresist film is the patterning step.

Examples of the organic semiconductor include, in addition to poly(3-hexylthiophene) (P3HT), polymer organic semiconductor materials such as poly(3-alkylthiophene), poly(3-octylthiophene), poly(2,5-thienylenevinylene) (PTV), poly(para-phenylenevinylene) (PPV), poly(9,9-dioctylfluorene) (PFO), poly(9,9-dioctylfluorene-co-bis-N,N'-(4-methoxyphenyl)-bis-N,N'-phenyl-1,4-phenylenediamine) (PFMO), poly(9,9-dioctylfluorene-co-benzothiadiazole) (BT), fluorene-triallylamine copolymers, triallylamine polymers, fluorene-bithiophene copolymers, e.g., poly(9,9-dioctylfluorene-co-dithiophene) (F8T2), and C60; metal phthalocyanine and substituted derivatives thereof; acene molecules such as anthracene, tetracene, pentacene, and hexacene; and low molecular organic semiconductors such as α-oligothiophenes, e.g., quarterthiophene (4T), sexithiophene (6T), and octathiophene. These organic semiconductors may be used alone or in a mixture of two or more thereof.

The organic semiconductor film 5 may be formed by CVD or vacuum deposition, instead of spin coating, or may be formed by ink jetting. Since the ink jetting can discharge a solution of the above-mentioned compound to a desired region, the patterning step can be omitted.

Step of Forming Source Electrode and Drain Electrode

Then, as shown in FIGS. 2A and 2B, a source electrode 7s and a drain electrode 7d are formed on the organic semiconductor film 5. For example, a gold (Au) film serving as an electroconductive film is deposited on the organic semiconductor film 5 by sputtering. Subsequently, the Au film is patterned into a pair of rectangles spaced with a predetermined distance from each other.

The electroconductive film may be made of other than Au, for example, Al, chromium (Cr), or tantalum (Ts). In addition, a material (electroconductive material) for the gate electrode, which is described below, may be used. The electroconductive film may be formed by applying a liquid material containing particles made of the above-mentioned electroconductive material on the organic semiconductor film 5 by spin coating, instead of sputtering, and drying and firing (crystallizing) the resulting coating. Subsequently, the film may be subjected to patterning. The source electrode 7s and the drain electrode 7d may be formed by coating the liquid material to a desired region by ink jetting, and drying and firing the coating. In this case, the patterning step can be omitted. In addition, the source electrode 7s and the drain electrode 7d may be formed by a lift-off method. For example, a photoresist film having openings corresponding to the shapes of the source electrode 7s and the drain electrode 7d is formed on a substrate 1, and then an electroconductive film is formed on the entire substrate 1. Then, the photoresist film is removed so that the electroconductive film remains at the openings of the photoresist film.

Step of Forming Gate Insulating Film

Then, as shown in FIGS. 3A to 3C, a gate insulating film 9 is formed on the organic semiconductor film 5, the source electrode 7s, and the drain electrode 7d. The gate insulating film 9 has a thickness of 10 nm or more and 1 μm or less. For example, the gate insulating film 9 is formed by applying a solution containing an insulating material such as polyimide or its precursor on the organic semiconductor film 5 and the electrodes by spin coating and heating the resulting coating. Alternatively, the gate insulating film 9 may be formed by discharging the solution by ink jetting and heating the resulting coating or may be formed by CVD.

The gate insulating film 9 may be made of an inorganic material or an organic material. Examples of the inorganic material include metal oxides such as silicon oxide, silicon nitride, aluminum oxide, and tantalum oxide; and metal composite oxides such as barium-strontium titanate and lead zirconium titanate. Examples of the organic material include polyesters, polycarbonates, polyvinyl alcohols, polyacetals, polyparaxylenes, polyacrylates, polyamides, polyamideimides, polyolefins, polyetherimides, polyphenylene ethers, polyphenylene sulfides, polyether sulfones, polyether ketones, polyphthalamides, polyethernitriles, polyether sulfones, polybenzimidazoles, polycarbodiimides, polysiloxanes, polymethylmethacrylates, polymethacrylamides, nitrile rubber, acrylic rubber, polyethylene tetrafluoride, epoxy resins, urethane resins, phenol resins, melamine resins, urea resins, polybutene, polypentene, polybutadiene, butyl rubber, polystyrenes, and polymers of these materials.

Step of Forming Gate Electrode

Then, as shown in FIGS. 3A and 3B, a gate electrode 11 is formed by forming an electroconductive film on the gate insulating film 9 and patterning the electroconductive film into a predetermined shape. For example, an electroconductive film is formed on the gate electrode by depositing an aluminum (Al) coating by sputtering. Subsequently, the Al film is patterned into a shape described below.

The gate electrode 11 may be made of a metal other than Al, such as Cr, Ta, molybdenum (Mo), niobium (Nb), copper (Cu), silver (Ag), gold (Au), platinum (Pt), palladium (pd), indium (In), or neodymium (Nd); an alloy containing any of these metals; or an electroconductive metal oxide such as $InO_2$, $SnO_2$, or ITO (indium tin oxide). Furthermore, electroconductive polymers such as polyaniline, polypyrrole, polythiophene, and polyacetylene and those containing various additives can be used. Examples of the additives include acids such as hydrochloric acid, sulfuric acid, and sulfonic acid; Lewis acids such as $PF_6$, $AsF_5$, and $FeCl_3$; halogen atoms such as iodine; and metal atoms such as sodium (Na) and potassium (K). Furthermore, the gate electrode 11 may be made of an electroconductive composite material dispersing carbon black or metal particles.

The gate electrode 11 may be formed by forming an electroconductive film by application of a liquid material containing electroconductive particles by spin coating or ink jetting and drying and firing (solidification) the resulting coating, and then patterning the electroconductive film. Furthermore, the gate electrode 11 may be formed by a lift-off method.

The characteristic structure in this embodiment is that apertures 11a are provided. In common transistors, a line-like gate electrode extends from above a source electrode 7s to above a drain electrode 7d. However, in this embodiment, the gate electrode 11 is provided with a plurality of apertures 11a.

Accordingly, as described above, light enters through the apertures 11a to a channel region CH and detraps carriers (electrons or holes) trapped in the channel region. As a result, deterioration in the characteristics of the thin film transistor can be suppressed, and a change in threshold and a decrease in mobility of carriers caused by the carriers trapped in the channel region CH can be minimized.

Structure of Gate Electrode

Figure 4A:
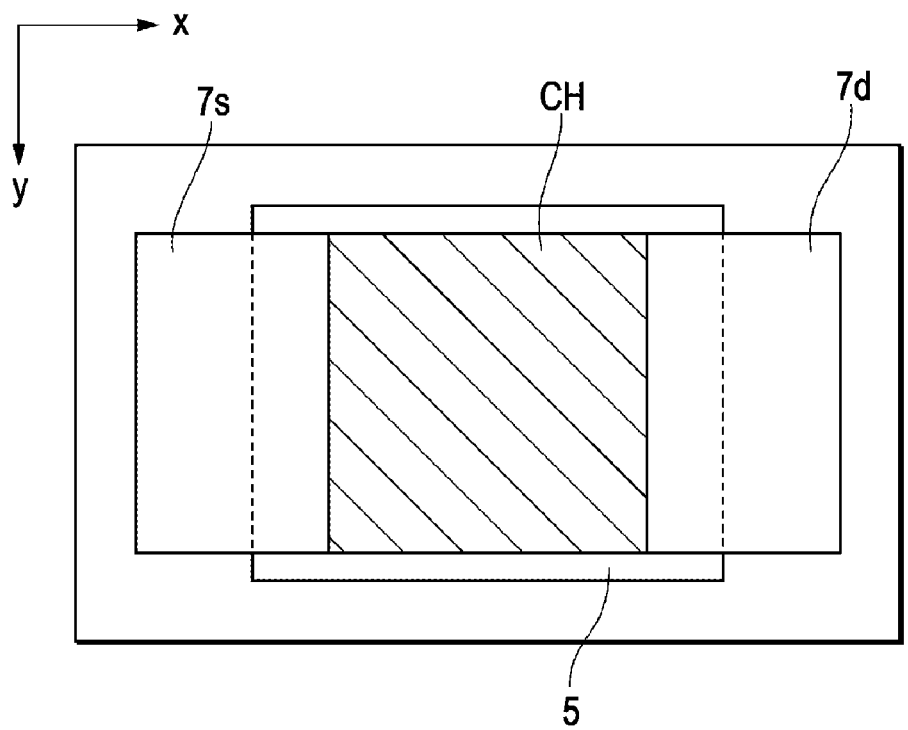
FIG. 4A is a plan view illustrating a gate electrode structure of an organic transistor according to the first embodiment.
Figure 4B:
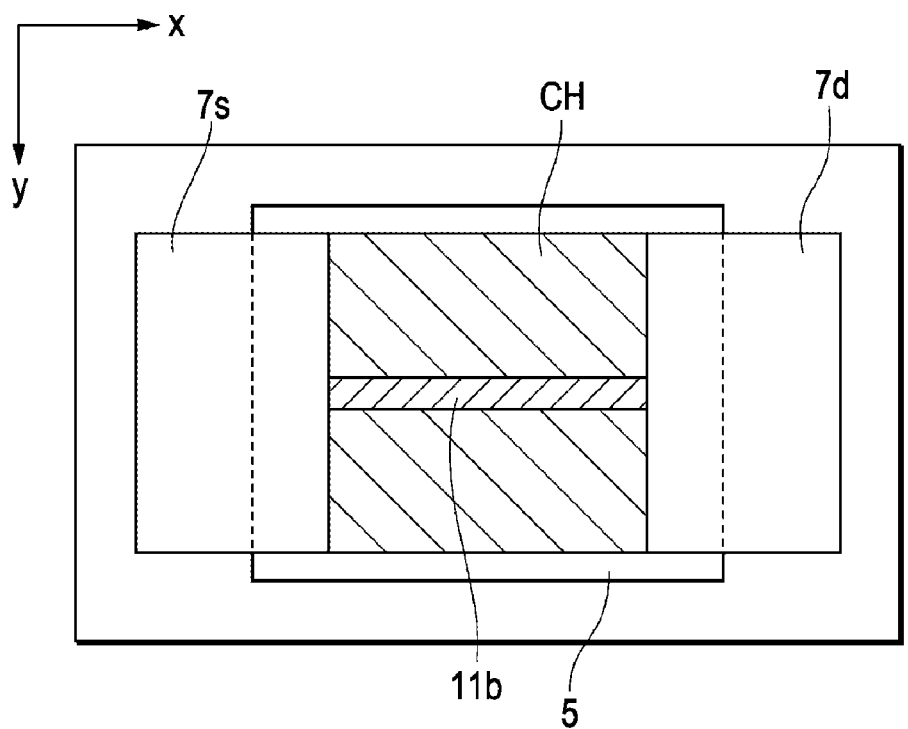
FIG. 4B is a plan view illustrating the gate electrode structure of the organic transistor according to the first embodiment.
Figure 5A:
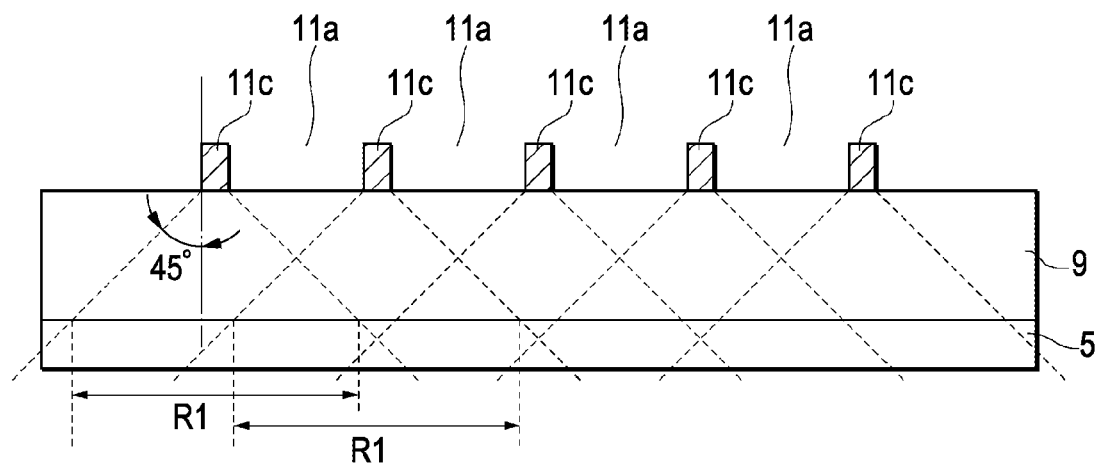
FIG. 5A is an enlarged cross-sectional view illustrating the gate electrode structure of the organic transistor according to the first embodiment.
Figure 5B:
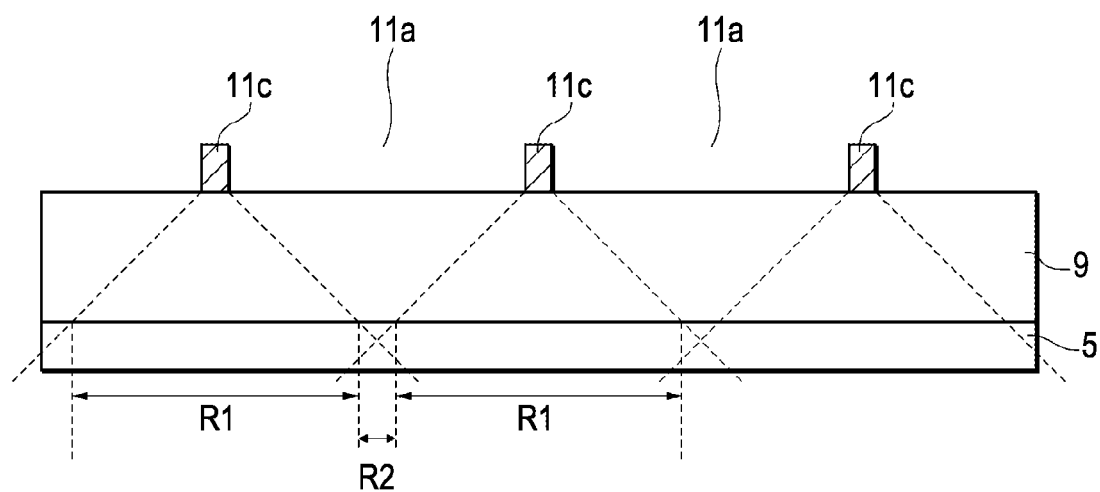
FIG. 5B is an enlarged cross-sectional view illustrating the gate electrode structure of the organic transistor according to the first embodiment.

FIGS. 4A and 4B are plan views and 5A and 5B are cross-sectional views for illustrating a structure of a gate electrode of an organic transistor according to this embodiment. FIG. 4A is a plan view showing a channel region CH, and FIG. 4B is a plan view showing a first wiring portion 11b of the gate electrode. FIGS. 5A and 5B are enlarged cross-sectional views showing second wiring portions 11c of the gate electrode.

The structure of the gate electrode of this embodiment will be described in further detail with reference to FIGS. 3A to 3C, 4A and 4B, and 5A and 5B.

As shown in FIG. 3C, the gate electrode 11 according to this embodiment is composed of a first wiring portion (first gate portion, path portion) 11b extending in the x-direction (see FIG. 4A) above the channel region CH and a plurality of second wiring portions (second gate portions) 11c extending in the y-direction. The second wiring portions 11c each have a width of d and extend in the y-direction with a distance of d therebetween. The first wiring portion 11b is arranged so as to be connected to the center of each of the second wiring portions 11c and extends in the x-direction from the source electrode 7s to the drain electrode 7d (see FIG. 4B).

Therefore, a path for electric current from the source electrode 7s to the drain electrode 7d is secured by at least the first wiring portion 11b. Accordingly, a channel current flows depending on the operation of the transistor.

Furthermore, as shown in FIG. 5A, when the projection regions R1 projected on the organic semiconductor film 5 from the ends of the apertures 11a toward the interior side of the apertures 11a at an angle of 45° from the vertical direction (the direction perpendicular to the gate insulating film direction 9) overlap each other, channels (path of current) are also generated below the apertures 11a. This is the finding of the present inventors. Within an angle of 45°, the gate voltage is properly applied to the channel portion.

Consequently, the path for electric current is increased, resulting in secure of a large channel current. Therefore, driving performance of the transistor can be increased.

The channel (path of current) is generated in the entire area below an aperture 11a provided that the maximum width of the aperture 11a is not larger than two times of the thickness of the gate insulating film 9. The thickness of the gate insulating film 9 herein means that at the position above the channel region CH (between the organic semiconductor film 5 and the gate electrode 11) (see FIG. 3A). In some cases, a channel (path of current) is generated in the entire area below the aperture 11a even if the maximum width of the aperture 11a is larger than two times of the thickness of the gate insulating film 9. For example, even if the long side of a rectangular aperture is larger than two times of the thickness of the gate insulating film 9, a channel (path of current) is generated in the entire area below the aperture 11a when the short side is not larger than two times of the thickness of the gate insulating film 9.

On the other hand, as shown in FIG. 5B, when the projection regions R1 do not overlap each other, regions R2 where channels are not generated occur below the apertures 11a. However, as described above, in the case, for example, that at least a path for current from the source electrode 7s to the drain electrode 7d is secured by the first wiring portion 11b, an organic transistor can be driven even in the structure shown in FIG. 5B.

Thus, the entire area of the channel region CH can be used as a current path by controlling the sizes of the apertures 11a, and thereby the transistor characteristics can be improved.

Process for Forming Gate Electrode

As described above, the gate electrode 11 of this embodiment can be formed by, for example, forming an electroconductive film by sputtering or using the above-mentioned solution, then forming a photoresist film having a shape indicated by the diagonal lines in FIG. 3C on the electroconductive film, and etching the electroconductive film.

Alternatively, the gate electrode 11 may be formed by forming a photoresist film having openings corresponding to the shape indicated by the diagonal lines in FIG. 3C, forming an electroconductive film in the entire area above a substrate 1, and then removing the photoresist film so that the electroconductive film remains at the openings of the photoresist film (lift-off method).

Alternatively, the gate electrode 11 may be formed by arranging a metal mask having openings corresponding to the shape indicated by the diagonal lines in FIG. 3C above a substrate 1 and depositing an electroconductive film by, for example, vacuum deposition through the mask. In this method, the patterning step can be omitted.

Step of Forming Protective Film

Then, a protective film (not shown) is optionally formed on the gate electrode 11. The protective film may be any insulating film. However, in a top gate-type, the overlying film on the gate electrode 11 is preferably light transmissive.

The organic transistor of this embodiment is completed by the above process.

Second Embodiment

The pattern of the gate electrode 11 in the first embodiment is that shown in FIG. 3C, but the gate electrode 11 is not limited to such a shape and can have various shapes.

FIGS. 6A to 6D are plan views illustration pattern examples of the gate electrode 11 according to a second embodiment. The organic transistor of this embodiment has the same configuration as that of the organic transistor of the first embodiment except the gate electrode 11. Accordingly, the organic transistor of this embodiment can be formed by the same process as that of the first embodiment except that the mask used in the patterning step of the gate electrode 11 is different.

First Example

Figure 6A:
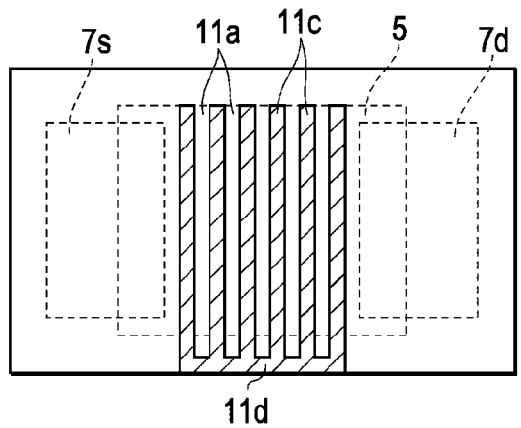
FIG. 6A is a plan view showing a pattern of a gate electrode 11 of an organic transistor according to a second embodiment of the invention.

A first example of the gate electrode 11 of this embodiment is shown in FIG. 6A. The gate electrode 11 is disposed above the organic semiconductor film 5 (channel region CH) and include a plurality of second wiring portions (second gate portion) 11c extending in the y-direction and a third wiring portion (third gate portion) 11d extending in the x-direction so as to connect the second wiring portions at the outside of the channel region CH. The second wiring portions 11c each have a width of d and extend in the y-direction with a distance of d therebetween. In this case, a channel (path of current) can be generated in the entire area below the aperture 11a by controlling the distance d not to be larger than the thickness of the gate insulating film 9.

Second Example

Figure 6B:
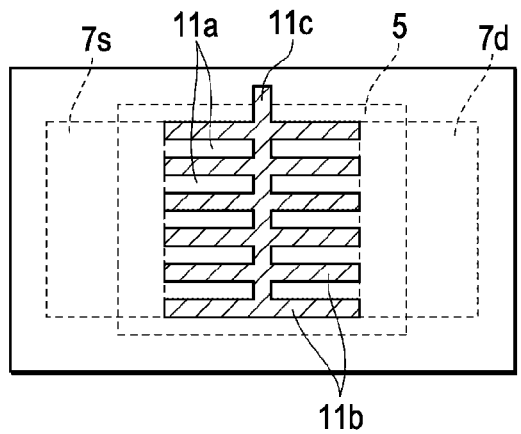
FIG. 6B is a plan view showing a pattern of the gate electrode 11 of the organic transistor according to the second embodiment.

A second example of the gate electrode 11 of this embodiment is shown in FIG. 6B. The gate electrode 11 is disposed above the organic semiconductor film 5 (channel region CH) and include a plurality of first wiring portions (first gate portions, path portions) 11b extending in the x-direction and a second wiring portion (second gate portion) 11c extending in the y-direction. The first wiring portions 11b each have a width of d and extend in the x-direction with a distance of d therebetween. The second wiring portion 11c extends in the y-direction so as to connect each center of the first wiring portions 11b.

In this case, since the first wiring portions 11b extend from the source electrode 7s to the drain electrode 7d, a path for current from the source electrode 7s to the drain electrode 7d is secured by the first wiring portions 11b. In addition, a channel (path of current) can be generated in the entire area below the aperture 11a by controlling the distance d not to be larger than the thickness of the gate insulating film 9.

Third Example

Figure 6C:
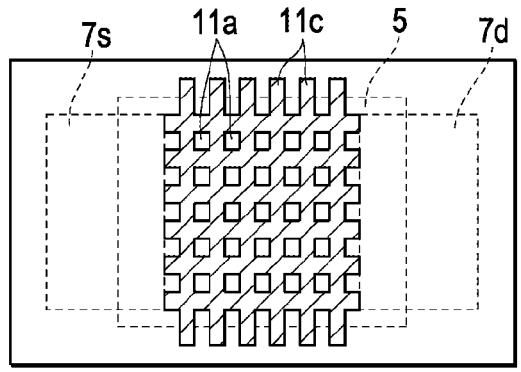
FIG. 6C is a plan view showing a pattern of the gate electrode 11 of the organic transistor according to the second embodiment.

A third example of the gate electrode 11 of this embodiment is shown in FIG. 6C. The gate electrode 11 is disposed above the organic semiconductor film 5 (channel region CH) and includes a plurality of first wiring portions (first gate portions, path portions) 11b extending in the x-direction and a plurality of second wiring portions (second gate portions) 11c extending in the y-direction. The first wiring portions 11b each have a width of d and extend in the x-direction with a distance of d therebetween, and second wiring portions 11c each have a width of d and extend in the y-direction with a distance of d therebetween.

In this case, since the first wiring portions 11b extend from the source electrode 7s to the drain electrode 7d, a path for current from the source electrode 7s to the drain electrode 7d is secured by the first wiring portions 11b. In addition, a channel (path of current) can be generated in the entire area below the aperture 11a by controlling the distance d not to be larger than the thickness of the gate insulating film 9.

Fourth Example

Figure 6D:
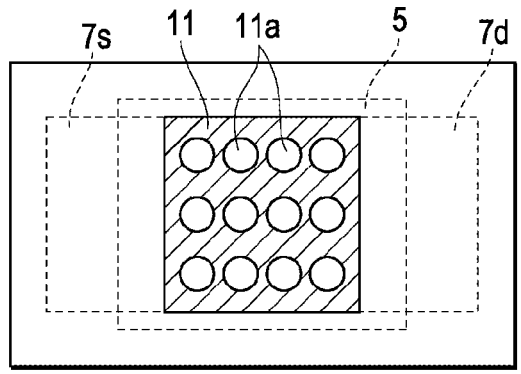
FIG. 6D is a plan view showing a pattern of the gate electrode 11 of the organic transistor according to the second embodiment.

A fourth example of the gate electrode 11 of this embodiment is shown in FIG. 6D. The gate electrode 11 is provided with approximately circular apertures 11a that are arranged in an array form. The aperture 11a has a radius of d (the diameter is 2d).

In this case, since a path portion extending from the source electrode 7s to the drain electrode 7d is generated on the organic semiconductor film 5 (channel region CH), a path for current from the source electrode 7s to the drain electrode 7d is secured by the gate electrode 11. In addition, a channel (path of current) can be generated in the entire area below the aperture 11a by controlling the radius d not to be larger than the thickness of the gate insulating film 9.

The organic transistor having the gate electrode of this embodiment can also achieve the same advantageous effects as those in the first embodiment.

Third Embodiment

In the first embodiment, the gate electrode 11 are provided with the apertures 11a (see FIG. 3A), but may be provided with recesses 11g.

Figure 7A:
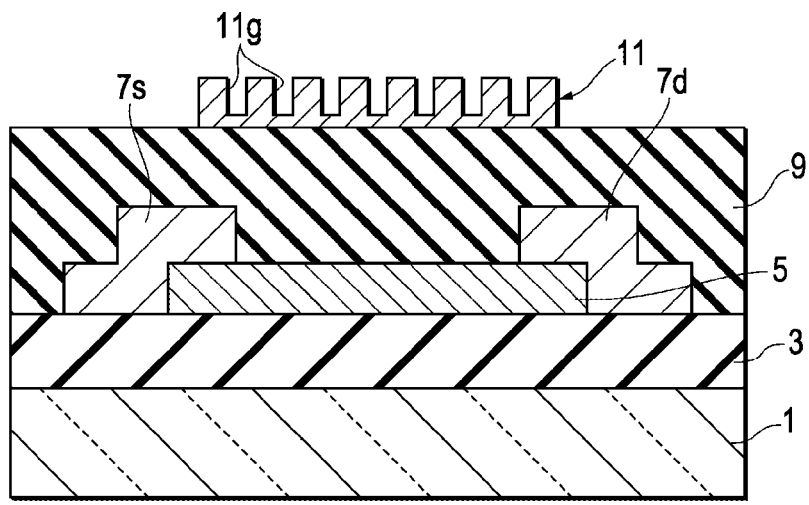
FIG. 7A is a cross-sectional view illustrating a structure of an organic transistor according to a third embodiment of the invention.
Figure 7B:
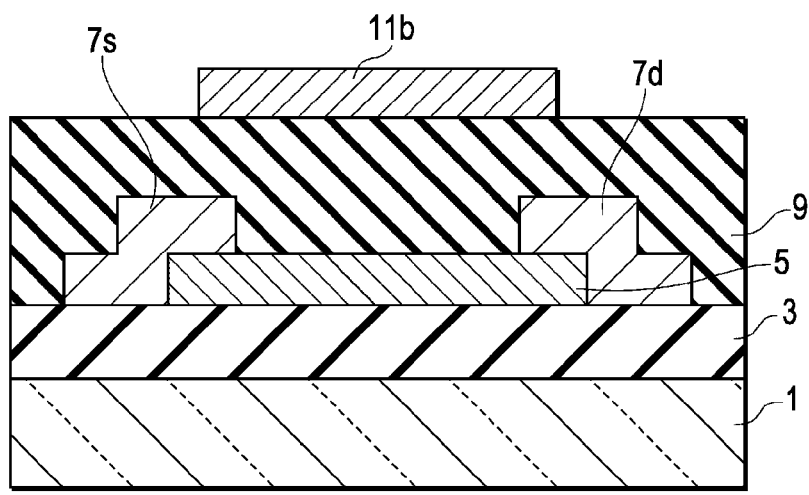
FIG. 7B is a cross-sectional view illustrating the structure of the organic transistor according to the third embodiment.
Figure 7C:
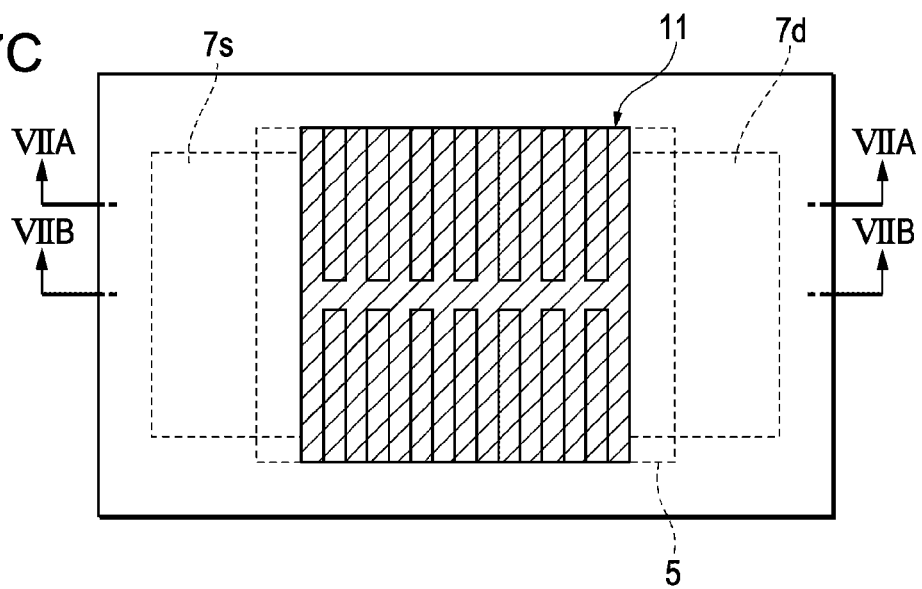
FIG. 7C is a plan view illustrating the structure of the organic transistor according to the third embodiment.

FIGS. 7A to 7C are cross-sectional views and a plan view illustrating a structure of an organic transistor according to a third embodiment. FIGS. 7A and 7B are cross sections taken along the VIIA-VIIA line and the VIIB-VIIB line of FIG. 7C, respectively.

In this embodiment, the gate electrode-forming step is carried out by, for example, etching using a mask of a photoresist film that is similar to that in the first embodiment (see FIG. 3C), but the etching is terminated such that a thin film of the gate electrode 11 remains as the bottom of each recess 11g. The thickness of the film of the gate electrode 11 serving as the bottom of each recess 11g is 100 nm or less and more preferably 50 nm or less.

Such a thin film can transmit light and detrap carriers (electrons or holes) trapped in the channel region. Therefore, deterioration in the characteristics of the thin film transistor can be suppressed, and a change in threshold and a decrease in mobility of carriers caused by the carriers trapped in the channel region can be minimized.

In addition, since the gate electrode 11 remains as the bottoms of the recesses 11g, channels are generated such regions. Consequently, a channel (path of current) is generated in the entire area below the recess 11g, resulting in an improvement in transistor characteristics.

The organic transistor of this embodiment has the same configuration as that of the organic transistor of the first embodiment except the gate electrode 11. Accordingly, the organic transistor of this embodiment can be formed by the same process as that in the first embodiment except the step of forming the gate electrode 11.

Fourth Embodiment

In the third embodiment, the gate electrode 11 has a monolayer structure, but an underlying film may be formed as the bottom of the recesses 11g.

Figure 8A:
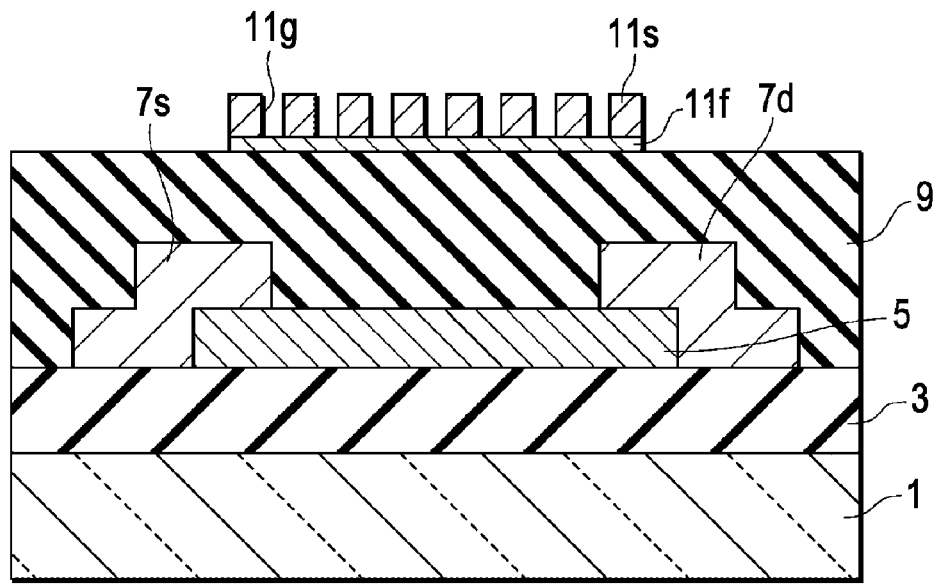
FIG. 8A is a cross-sectional view illustrating a structure of an organic transistor according to a fourth embodiment of the invention.
Figure 8B:
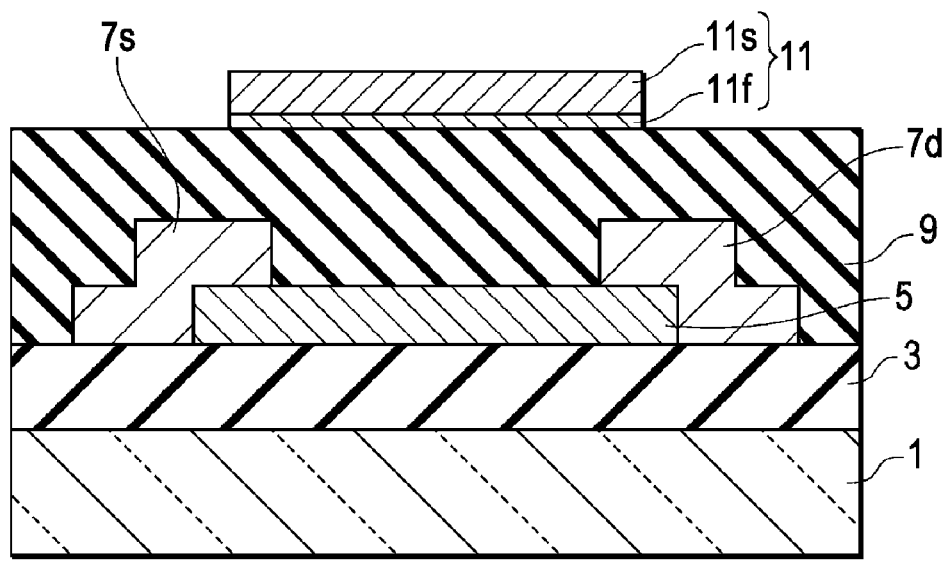
FIG. 8B is a cross-sectional view illustrating the structure of the organic transistor according to the fourth embodiment.

FIGS. 8A and 8B are cross-sectional views illustrating a structure of an organic transistor according to a fourth embodiment and correspond to cross sections taken along the VIIA-VIIA line and the VIIB-VIIB line of FIG. 7C, respectively, except the recesses 11g.

In this embodiment, the gate electrode is formed by, for example, forming a first electroconductive film 11f on the gate insulating film 9 and forming a second electroconductive film 11s on the first electroconductive film 11f. The thickness of the first electroconductive film 11f is 100 nm or less and more preferably 50 nm or less. Then, the second electroconductive film 11s is etched using a mask of the same photoresist film as that used in the first embodiment (see FIG. 3C) so that the first electroconductive film 11f is exposed. In this case, the bottom of each recess 11g is made of the thin film of the first electroconductive film 11f functioning as the gate electrode 11.

Consequently, the first electroconductive film 11f can transmit light and detrap carriers (electrons or holes) trapped in the channel region. Therefore, deterioration in the characteristics of the thin film transistor can be suppressed, and a change in threshold and a decrease in mobility of carriers caused by the carriers trapped in the channel region can be minimized.

Furthermore, in this embodiment, since the first electroconductive film 11f and the second electroconductive film 11s are made of different electroconductive films, the endpoint of etching can be readily decided and the thickness of the film remaining as the bottoms of the recesses 11g can be readily controlled.

The first and second electroconductive films 11f and 11s may be made of any material without particular limitation, and the electroconductive materials described in the first embodiment can be used. The detrapping effect can be enhanced by using a first electroconductive film having a light transmissivity higher than that of the second electroconductive film.

The organic transistor of this embodiment has the same configuration as that of the organic transistor of the first embodiment except the gate electrode 11. Accordingly, the organic transistor of this embodiment can be formed by the same process as that of the first embodiment except the step of forming the gate electrode 11.

Fifth Embodiment

Figure 9A:
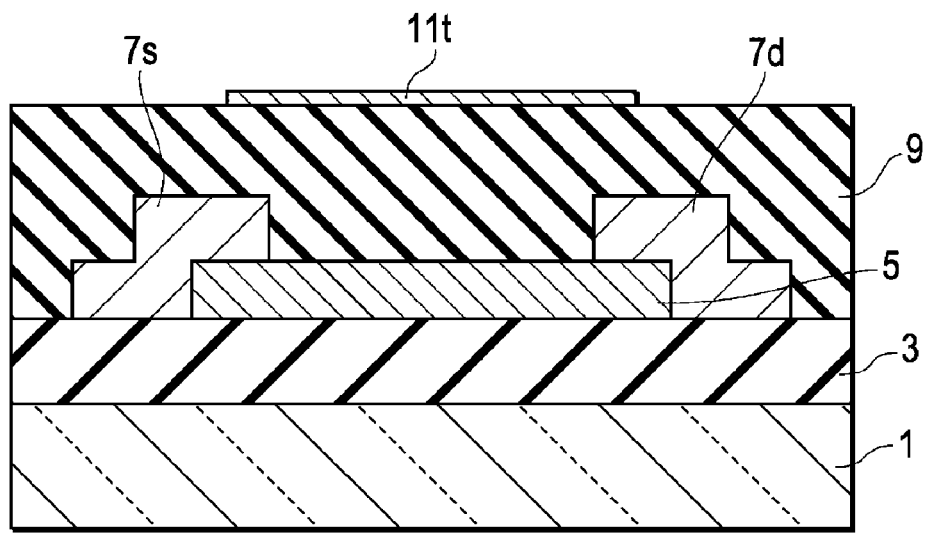
FIG. 9A is a cross-sectional view illustrating a structure of an organic transistor according to a fifth embodiment of the invention.
Figure 9B:
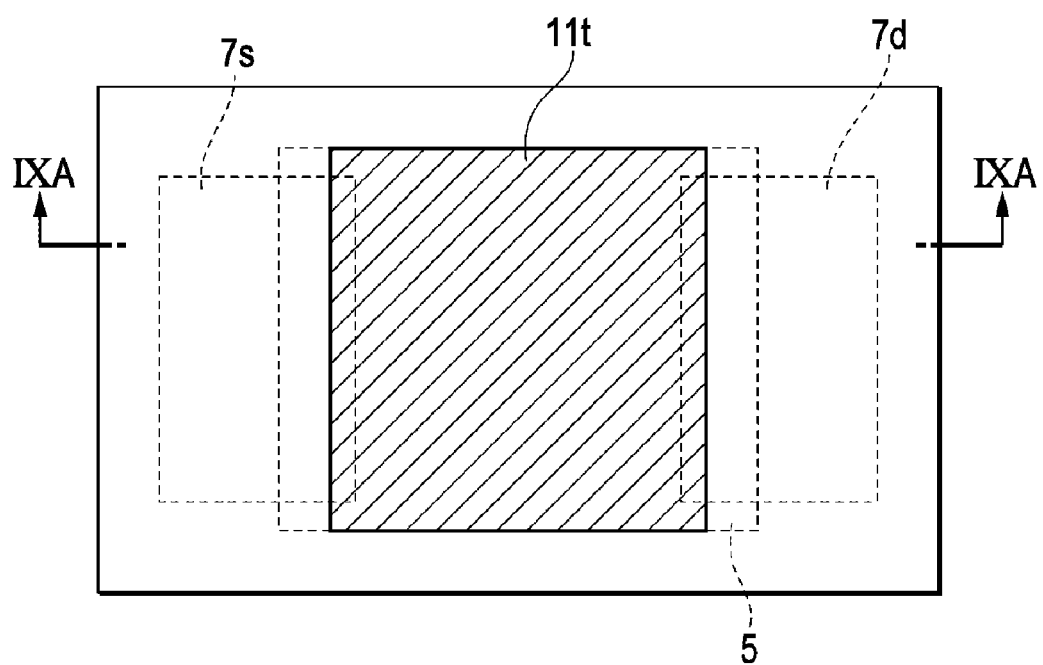
FIG. 9B is a plan view illustrating the structure of the organic transistor according to the fifth embodiment.

The thickness of the gate electrode 11 may be small. FIGS. 9A and 9B are cross-sectional view and a plan view illustrating a structure of an organic transistor according to a fifth embodiment, respectively. FIG. 9A is a cross section taken along the IXA-IXA line of FIG. 9B.

In this embodiment, a gate electrode 11t is formed by, for example, as shown in FIG. 9A, depositing an electroconductive film having a thickness of 100 nm or less, more preferably 50 nm or less, on the gate insulating film 9 and patterning the film into an approximately rectangular shape as shown in FIG. 9B. That is, the gate electrode 11t does not have the apertures 11a described in the above-described embodiments.

Such a thin film can transmit light without requiring apertures and detrap carriers (electrons or holes) trapped in the channel region. Therefore, deterioration in the characteristics of the thin film transistor can be suppressed, and a change in threshold and a decrease in mobility of carriers caused by the carriers trapped in the channel region can be minimized.

The electroconductive film in this embodiment may be made of any material without particular limitation, and the electroconductive materials described in the first embodiment can be used.

The organic transistor of this embodiment has the same configuration as that of the organic transistor of the first embodiment except the gate electrode 11. Accordingly, the organic transistor of this embodiment can be formed by the same process as that in the first embodiment except the step of forming the gate electrode 11.

Sixth Embodiment

In first to fourth embodiments, the gate electrode 11 is provided with apertures 11a or recesses 11g, but the gate electrode 11 may be made of a porous material.

Figure 10A:
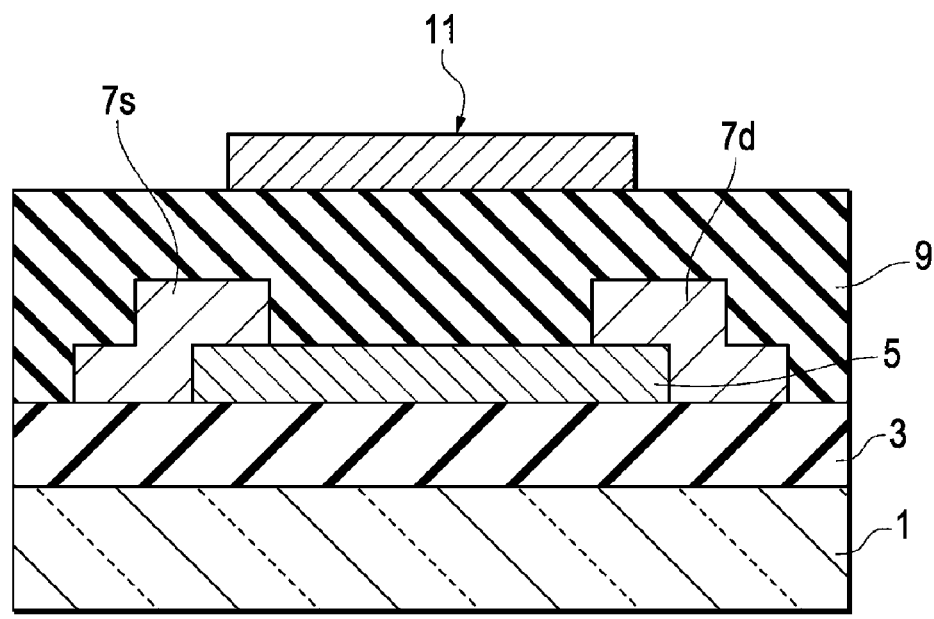
FIG. 10A is a cross-sectional view illustrating a structure of an organic transistor according to a sixth embodiment of the invention.
Figure 10B:
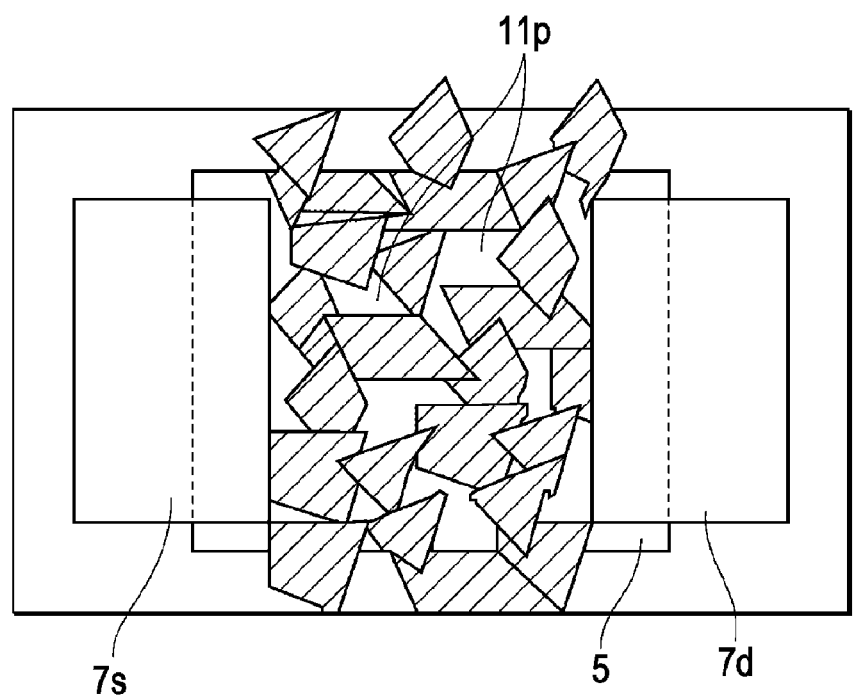
FIG. 10B is a plan view illustrating the structure of the organic transistor according to the sixth embodiment.

FIGS. 10A and 10B are cross-sectional view and a plan view illustrating a structure of an organic transistor according to a sixth embodiment, respectively.

In this embodiment, the gate electrode is formed by, for example, applying a liquid material containing electroconductive particles on the organic semiconductor film 5 by ink jetting into, for example, a rectangular shape and drying and firing (solidification) the resulting coating to give an electroconductive film. On this occasion, pores (interstices, holes) 11p are formed in the film by controlling the diameter of the electroconductive particles and the solvent (dispersion) dispersing the particles.

In this embodiment, light enters the channel region through the pores 11p and can detrap carriers (electrons or holes) trapped in the channel region. Therefore, deterioration in the characteristics of the thin film transistor can be suppressed, and a change in threshold and a decrease in mobility of carriers caused by the carriers trapped in the channel region can be minimized.

In the above step, fine patterning for forming apertures 11a is unnecessary. Therefore, the organic transistor can be produced through a simple process inexpensively.

The gate electrode 11 may be formed by spin coating instead of the ink jetting. In the spin coating, a step of patterning the electroconductive film into, for example, a rectangular shape is necessary, but fine patterning is unnecessary. Therefore, advanced control of etching is unnecessary.

The porous gate electrode 11 is preferably formed by, for example, using electroconductive microparticles having a particle size (diameter) of about from 100 nm to 1 μm. The concentration of the electroconductive microparticles in a dispersion liquid is preferably 1 to 50%. With such a concentration, a gate electrode 11 having satisfactory pores can be formed.

The light transmissivity of the porous gate electrode 11 is 20 to 80% and more preferably about 40 to 60%.

The organic transistor of this embodiment has the same configuration as that of the organic transistor of the first embodiment except the gate electrode 11. Accordingly, the organic transistor of this embodiment can be formed by the same process as that in the first embodiment except the step of forming the gate electrode 11.

Seventh Embodiment

In the above embodiments, top-gate/top-contact transistors have been described, but the present invention can be applied to transistors having other structures.

Figure 11A:
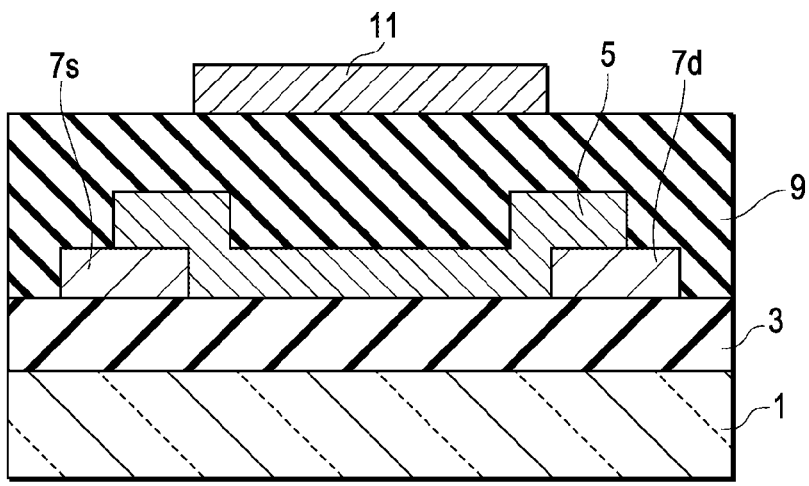
FIG. 11A is a cross-sectional view illustrating a structure of an organic transistor according to a seventh embodiment of the invention.
Figure 11B:
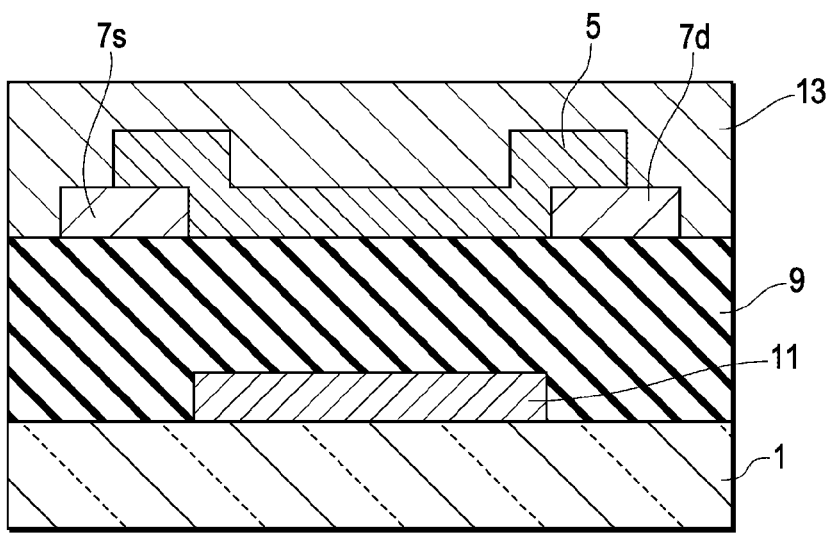
FIG. 11B is a cross-sectional view illustrating a structure of an organic transistor according to the seventh embodiment.
Figure 11C:
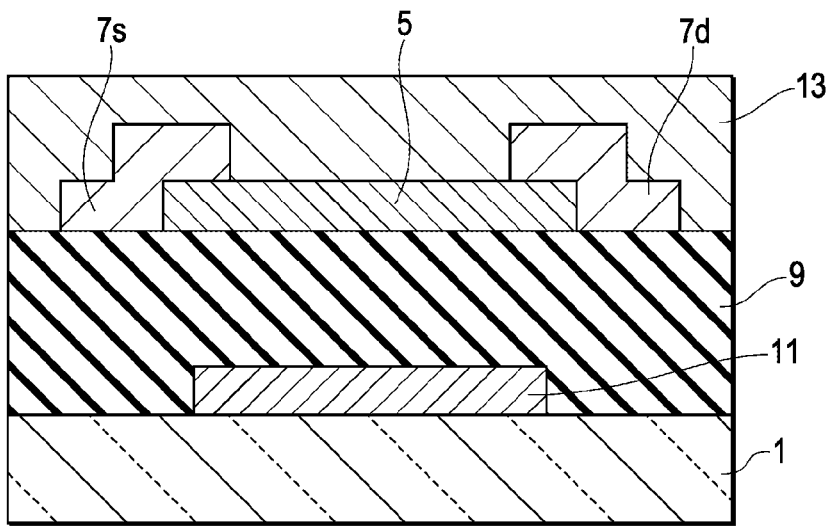
FIG. 11C is a cross-sectional view illustrating a structure of an organic transistor according to the seventh embodiment.

FIGS. 11A to 11C are cross-sectional views illustrating the structure of an organic transistor according to a seventh embodiment.

FIG. 11A is a cross-sectional view of a top-gate/bottom-contact transistor.

This organic transistor includes an underlying insulating film 3 disposed on a substrate 1, a source electrode 7s and a drain electrode 7d disposed so as to be oppose each other with a certain distance on the underlying insulating film 3, an organic semiconductor film 5 disposed on the underlying insulating film 3 exposing between the source electrode 7s and the drain electrode 7d such that the organic semiconductor film 5 is in contact with the source electrode 7s and the drain electrode 7d, and a gate electrode 11 disposed above the organic semiconductor film 5 via a gate insulating film 9.

The gate electrode 11 has the apertures 11a or the recesses 11g described in the first to fourth embodiments. Alternatively, the gate electrode 11 may be formed so as to have a small thickness of 100 nm or less, more preferably 50 nm or less, as described in the fifth embodiment or may be formed of a porous film as described in the sixth embodiment.

These organic transistors can be formed by conducting the steps described in the first embodiment, that is, "step of forming underlying insulating film", "step of forming source electrode and drain electrode", "step of forming organic semiconductor film", "step of forming gate insulating film", and "step of forming gate electrode".

FIG. 11B is a cross-sectional view illustrating a bottom-gate/bottom-contact transistor.

This organic transistor includes a gate electrode 11 disposed on a substrate 1, a gate insulating film 9 disposed thereon, a source electrode 7s and a drain electrode 7d disposed so as to oppose each other with a certain distance on the gate insulating film 9, an organic semiconductor film 5 disposed on the gate insulating film 9 exposing between the source electrode 7s and the drain electrode 7d such that the organic semiconductor film 5 is in contact with the source electrode 7s and the drain electrode 7d, and a protective film 13 disposed on the organic semiconductor film 5. In this organic transistor, the underlying insulating film 3 is unnecessary.

The gate electrode 11 has the apertures 11a or the recesses 11g described in the first to fourth embodiments. Alternatively, the gate electrode 11 may be formed so as to have a small thickness of 100 nm or less, more preferably 50 nm or less, as described in the fifth embodiment or may be formed of a porous film as described in the sixth embodiment.

These organic transistors can be formed by conducting the steps described in the first embodiment, that is, "step of forming gate electrode", "step of forming gate insulating film", "step of forming source electrode and drain electrode", "step of forming organic semiconductor film", and "step of forming protective film". In the bottom-gate types as shown in FIGS. 11B and 11C, the substrate 1 disposed under the gate electrode 11 must be light transmissive.

FIG. 11C is a cross-sectional view illustrating a bottom-gate/top-contact transistor.

This organic transistor includes a gate electrode 11 disposed on a substrate 1, a gate insulating film 9 disposed thereon, an organic semiconductor film 5 disposed on the gate insulating film 9, a source electrode 7s and a drain electrode 7d disposed so as to oppose each other with a certain distance on the organic semiconductor film 5, and a protective film 13 disposed on the organic semiconductor film 5. In this organic transistor, the underlying insulating film 3 is unnecessary.

The gate electrode 11 has the apertures 11a or the recesses 11g described in the first to fourth embodiments. Alternatively, the gate electrode 11 may be formed so as to have a small thickness of 100 nm or less, more preferably 50 nm or less, as described in the fifth embodiment or may be formed of a porous film as described in the sixth embodiment.

These organic transistors can be formed by conducting the steps described in the first embodiment, that is, "step of forming gate film", "step of forming gate insulating film", "step of forming organic semiconductor film", "step of forming source electrode and drain electrode", and "step of forming protective film".

Electrooptical Device and Electronic Apparatus

Figure 12:
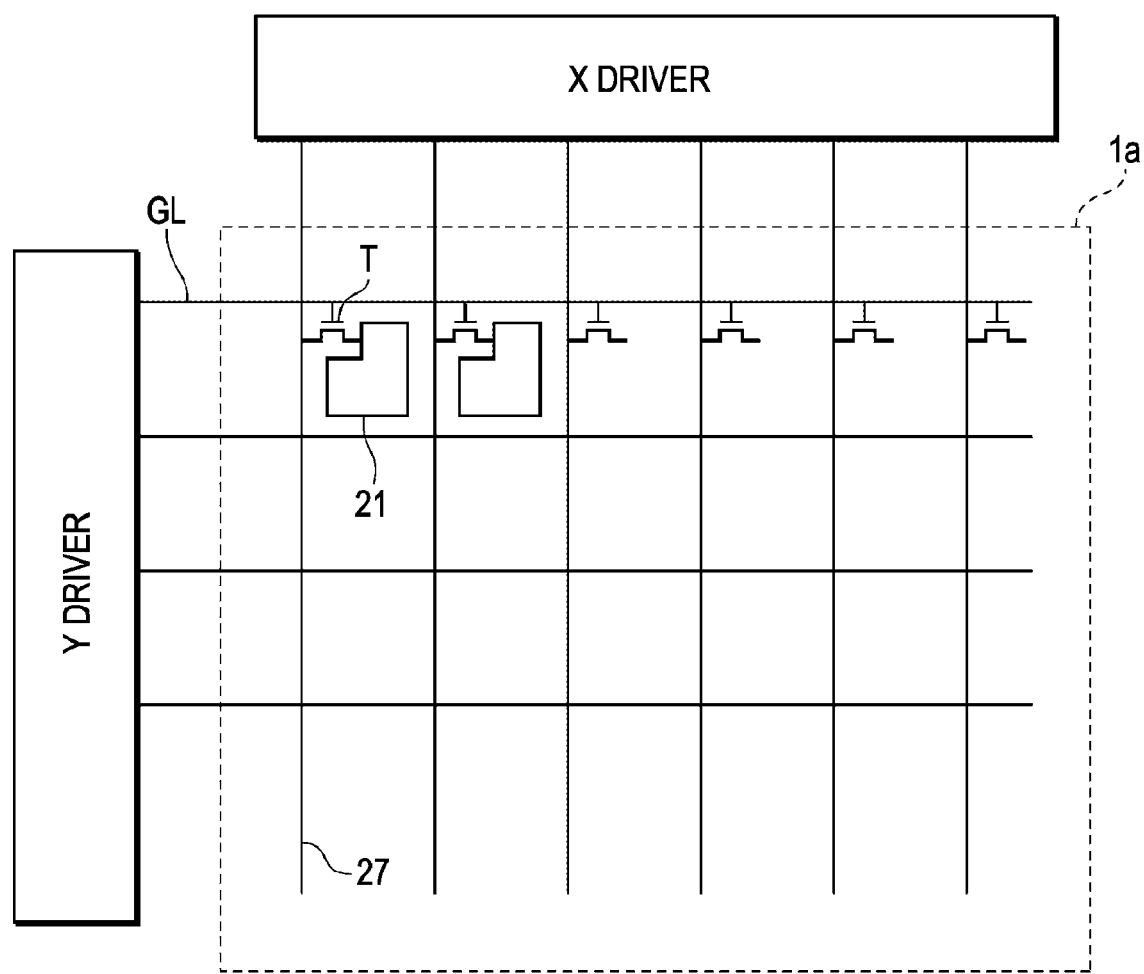
FIG. 12 is a circuit diagram illustrating a structure of an active matrix substrate including organic transistors.

FIG. 12 is a circuit diagram illustrating a structure of an active matrix substrate including organic transistors. As shown in FIG. 12, a display 1 includes a plurality of pixels arranged in a display region 1a in a matrix form. The pixels are arranged at intersection points of wiring lines 27 and gate electrode lines GL. Each pixel includes a pixel electrode 21 and an organic transistor T. For example, the wiring lines 27 are driven by X drivers, and the gate electrode lines GL are driven by Y drivers.

Each of the above-described organic transistors can be used as the thin film transistor T of the active matrix substrate. In addition, the organic transistors can be used as peripheral circuits used in the X drivers and the Y drivers.

Figure 13A:
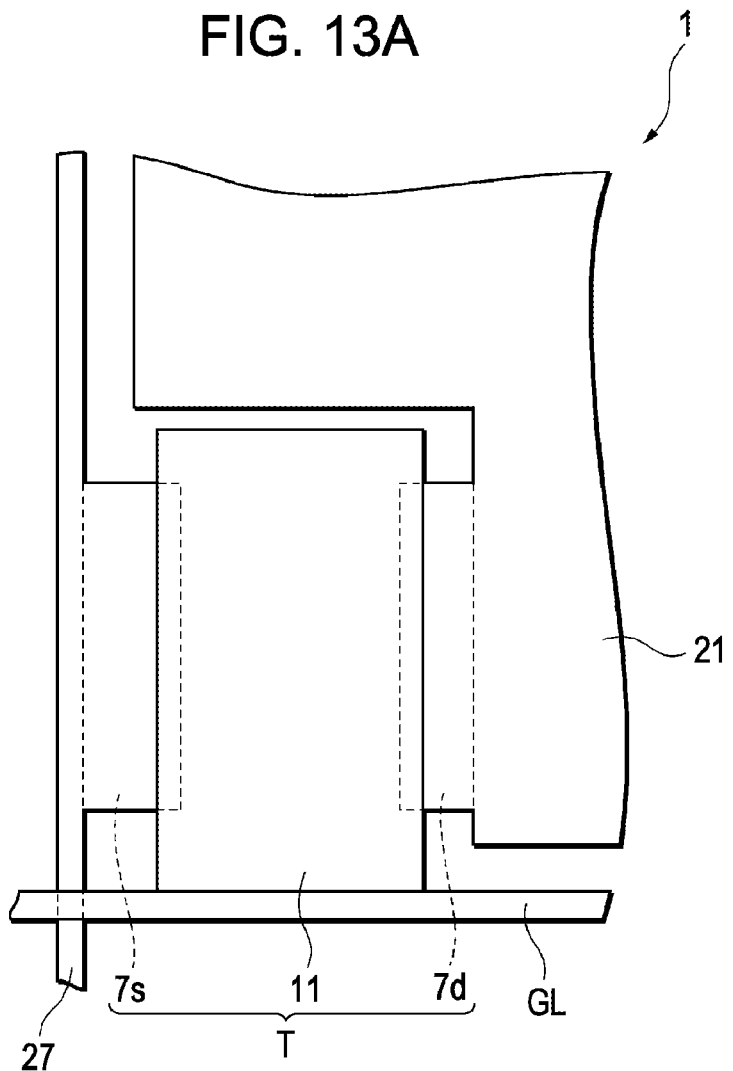
FIG. 13A is a plan view illustrating a structure of an electrophoresis device including an active matrix substrate.
Figure 13B:
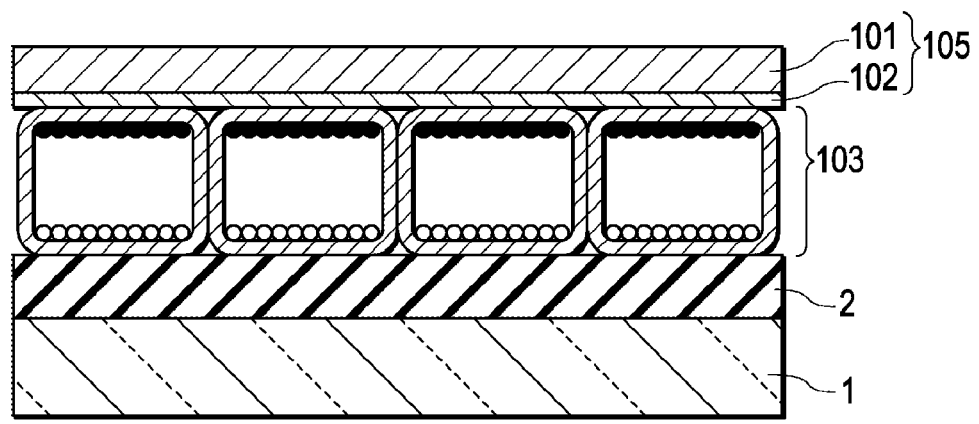
FIG. 13B is a cross-sectional view illustrating the structure of the electrophoresis device including the active matrix substrate.

FIGS. 13A and 13B are a plan view and a cross-sectional view of a structure of an electrophoresis device having the active matrix substrate, respectively.

As shown in FIG. 13A, the active matrix substrate 1 includes a wiring line 27, a gate electrode line GL, and a pixel electrode 21 and an organic transistor T that are arranged at an intersection point of the wiring line 27 and the gate electrode line GL. The organic transistors are arranged in an upper layer 2 of the active matrix substrate 1 shown in FIG. 13B, wherein, for example, the source electrodes 7s are connected to the wiring line (source lines) 27, and the drain electrodes 7d are connected to the pixel electrodes 21.

As shown in FIG. 13B, the upper layer 2 of the active matrix substrate 1 is an element layer 2 including the organic transistors T, the pixel electrodes 21, and other elements. An electrophoresis sheet 105 including a plurality of microcapsules 103 is disposed on the element layer 2. The electrophoresis sheet 105 further includes an opposite substrate 101 on which an opposite electrode 102 is provided.

In the microcapsules 103, a plurality of different electrophoresis particles having different characteristics are encapsulated. For example, an electrophoresis dispersion liquid containing two different electrophoresis particles having different charges and different colors is encapsulated in the microcapsules 103. The opposite electrode 102 is made of a transparent electrode material such as ITO.

In the electrophoresis display device, when a selection signal (selection voltage) is supplied to a gate line GL, the organic transistor T connected to this gate line GL supplied with the selection signal is turned to the on state. With this, the wiring line 27 and the pixel electrode 21 that are connected to this organic transistor T are electrically connected. On this occasion, if desired data (voltage) is supplied to the wiring line 27, the data (voltage) is supplied to the pixel electrode 21. Furthermore, an electric field is generated between the pixel electrode 21 and the opposite electrode 102. The electrophoresis particles in the microcapsules 103 are electrophoresed toward the electrode 102 (upper side) or the pixel electrode 21 (lower side) according to the direction and the intensity of the electric field.

From this state, when the supply of the selection signal to the gate line GL is stopped, the organic transistor is turned to the off state. Accordingly, the wiring line 27 and the pixel electrode 21 that are connected to the organic transistor T are electrically disconnected.

Therefore, a desired image can be displayed on the display pixels of the electrophoresis display device by properly combining the supply of selection signal to the gate line GL and the discontinuance of the supply or the supply of data to the wiring line 27 and the discontinuance of the supply.

Thus, characteristics of the active matrix substrate 1 and the electrophoresis display device can be improved by building the organic transistors described in the embodiments thereinto.

Figure 14:
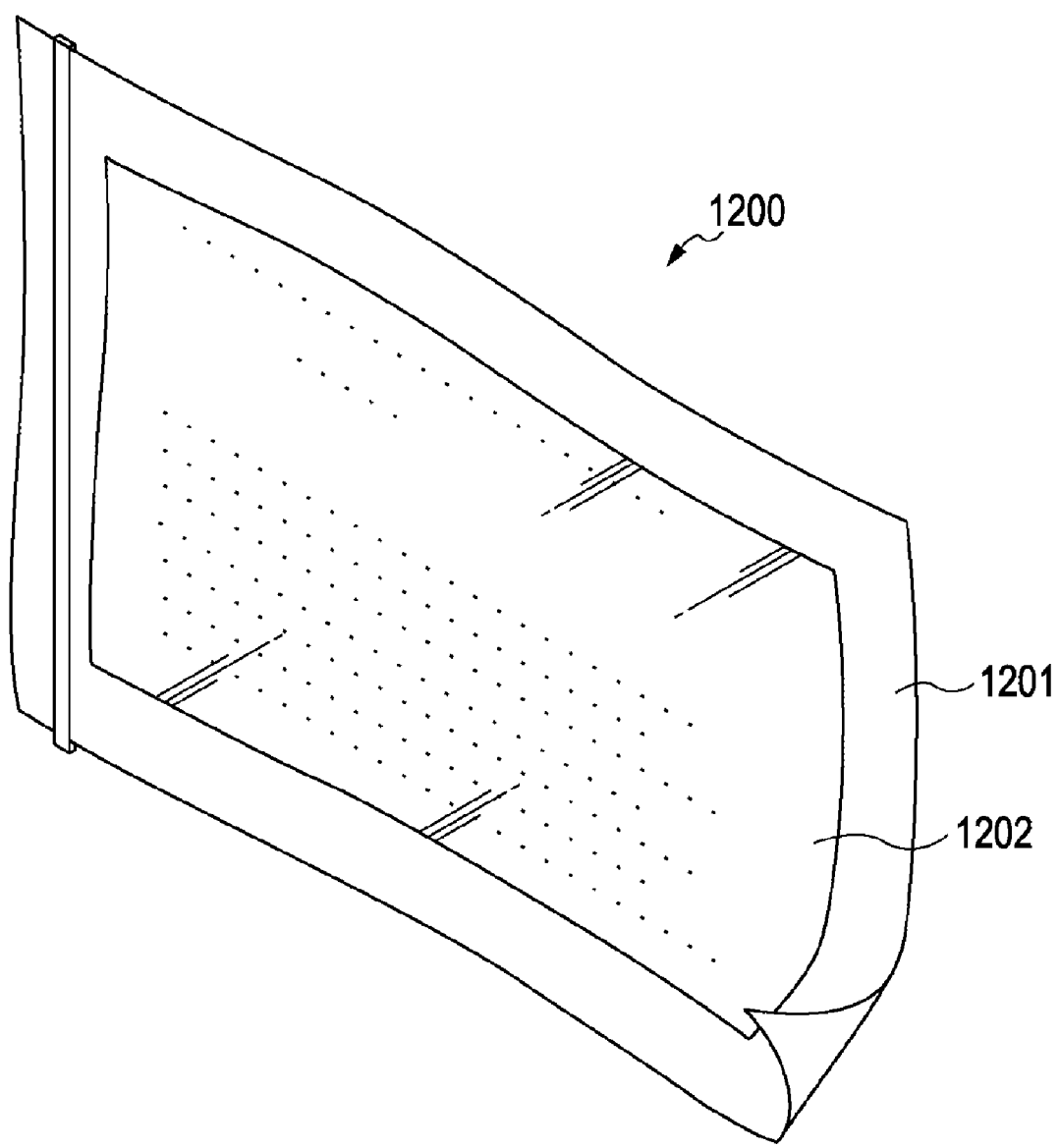
FIG. 14 is a perspective view illustrating an electronic paper.

The electrophoresis display device can be built in various electronic apparatuses. As an example of the electronic apparatuses, an electronic paper will now be described. FIG. 14 is a perspective view of the electronic paper.

The electronic paper 1200 shown in FIG. 14 includes a body 1201 of a rewritable sheet having a texture and a flexibility similar to those of paper and a display unit 1202. In the electronic paper 1200, the display unit 1202 includes the electrophoresis display device.

The electronic paper can be used for, for example, displaying character information such as newspaper articles. The electronic paper uses a relatively large driving voltage and is hardly affected by off current of the organic transistor. In addition, the electronic paper needs a long period of time for switching a display image, and, accordingly, the advantageous effect of the detrapping of carriers by light irradiation takes precedence over the demerit due to the off current. Furthermore, since the electronic paper is mostly used under light, accumulated carriers can be occasionally detrapped in a state not being used (off state of transistor), which leads to an improvement in quality and allows the electronic paper to be used for a long time. Thus, the organic transistors described in the embodiments can be suitably used in the electronic paper.

The electrophoresis display device can be widely applied to various electronic apparatuses utilizing electrophoresis displays, such as personal computers and timepieces, in addition to the electronic paper.

The organic transistors and the active matrix substrates according to the above-described embodiments can be applied not only to the electrophoresis display device but also to, for example, display devices having organic electroluminescence (EL) or liquid crystal.

Examples of the electronic apparatuses including these display devices include televisions, viewfinders, video tape recorders having a direct monitor view, car navigation systems, pagers, electronic schedulers, calculators, electronic newspapers, word processors, personal computers, work stations, television telephones, POS terminals, and apparatuses having touch panels. The display device, the active matrix substrate, and the organic transistor can be applied to the displays of these electronic apparatuses.

The examples and application examples described through the embodiments can be used by properly combining, modifying, or improving them depending on the intended use, and the invention is not limited to the descriptions of the embodiments.

The entire disclosure of Japanese Patent Application No. 2008-011698, filed Jan. 22, 2008 is expressly incorporated by reference herein.

What is claimed is:

1. A thin film transistor comprising:
a substrate;
a source electrode and a drain electrode disposed above the substrate so as to oppose each other;
an organic semiconductor film disposed between the source electrode and the drain electrode to generate a channel region; and
a gate electrode disposed opposite the organic semiconductor film via a gate insulating film,
wherein
the gate electrode includes an aperture at an area overlapping the channel region; and
the gate insulating film is disposed between the aperture of the gate electrode and the organic semiconductor film in plan view.

2. The thin film transistor according to claim 1, wherein the gate electrode includes a path, in the channel region, connecting a region where the gate electrode overlaps the source electrode to a region where the gate electrode overlaps the drain electrode.

3. The thin film transistor according to claim 1, wherein a projection region projected on the organic semiconductor film covers the aperture when the projection region is projected from an end of the aperture toward the interior side of the aperture at an angle of 45° from the direction perpendicular to the gate insulating film direction.

4. The thin film transistor according to claim 3, wherein the aperture lies above the source electrode or the drain electrode.

5. The thin film transistor according to claim 1, wherein the gate electrode includes a plurality of first wiring lines, in the channel region, extending in a first direction from the source electrode to the drain electrode and disposed with a certain distance therebetween.

6. The thin film transistor according to claim 1, wherein the gate electrode includes a plurality of second wiring lines, in the channel region, extending in a second direction that intersects a first direction from the source electrode to the drain electrode and disposed with a certain distance therebetween.

7. The thin film transistor according to claim 6, wherein the second wiring lines are connected to one another with a third wiring line extending in the first direction in a region outside the channel region.

8. The thin film transistor according to claim 1, wherein the gate electrode includes, in the channel region, a plurality of first wiring lines extending in a first direction from the source electrode to the drain electrode and disposed with a certain distance therebetween and a plurality of second wiring lines extending in a second direction that intersects the first direction and disposed with a certain distance therebetween.

9. The thin film transistor according to claim 1, wherein
the gate electrode includes a plurality of apertures in the channel region, and
the plurality of apertures are arranged in an array form.

10. A thin film transistor comprising:
a substrate;
a source electrode and a drain electrode disposed above the substrate so as to oppose each other;
an organic semiconductor film disposed between the source electrode and the drain electrode; and
a gate electrode disposed opposite a first face or a second face of the organic semiconductor film via a gate insulating film,
wherein
the gate electrode is an electroconductive film formed by solidifying a dispersion liquid containing electroconductive particles and having pores therein; and
the gate insulating film is disposed between the pores of the gate electrode and the organic semiconductor film in plan view.

11. A thin film transistor comprising:
a substrate;
a source electrode and a drain electrode disposed above the substrate so as to oppose each other;
an organic semiconductor film disposed between the source electrode and the drain electrode;
a gate electrode disposed opposite a first face or a second face of the organic semiconductor film via a gate insulating film,
wherein
the gate electrode includes a recess in the channel region that is a region lying between the source electrode and the drain electrode and overlapping the organic semiconductor film;
the gate insulating film is disposed between the recess of the gate electrode and the organic semiconductor film in plan view.

12. The thin film transistor according to claim 11, wherein the thickness of the gate electrode at an area serving as the bottom of recess is 100 nm or less.

13. The thin film transistor according to claim 11, wherein the thickness of the gate electrode at an area serving as the bottom of recess is 50 nm or less.

14. The thin film transistor according to claim 11, wherein the gate electrode includes a laminated film of a first electroconductive film and a second electroconductive film, and the first electroconductive film is exposed to serve as the bottom of the recess.

15. The thin film transistor according to claim 14, wherein the thickness of the first electroconductive film is 100 nm or less.

16. The thin film transistor according to claim 14, wherein the thickness of the first electroconductive film is 50 nm or less.

17. A matrix substrate comprising a plurality of thin film transistors according to claim 1.

18. An electrophoresis display device comprising the matrix substrate according to claim 17.

19. An electronic apparatus comprising the electrophoresis display device according to claim 18.

* * * * *